US011929011B2

(12) United States Patent
Robin et al.

(10) Patent No.: US 11,929,011 B2
(45) Date of Patent: Mar. 12, 2024

(54) OPTOELECTRONIC DEVICE HAVING OPTICAL SYSTEMS THAT CAN BE MOVED BETWEEN DIFFERENT PIXELS, AND CONTROL METHOD

(71) Applicant: ALEDIA, Échirolles (FR)

(72) Inventors: Ivan-Christophe Robin, Grenoble (FR); Olivier Jeannin, Grenoble (FR); Frédéric Mayer, Voiron (FR)

(73) Assignee: ALEDIA, Échirolles (FR)

( * ) Notice: Subject to any disclaimer, the term of this patent is extended or adjusted under 35 U.S.C. 154(b) by 211 days.

(21) Appl. No.: 17/613,253

(22) PCT Filed: May 6, 2020

(86) PCT No.: PCT/FR2020/050756
§ 371 (c)(1),
(2) Date: Nov. 22, 2021

(87) PCT Pub. No.: WO2020/240106
PCT Pub. Date: Dec. 3, 2020

(65) Prior Publication Data
US 2022/0223100 A1   Jul. 14, 2022

(30) Foreign Application Priority Data

May 24, 2019   (FR) ..................................... 19/05483

(51) Int. Cl.
*G09G 3/32* (2016.01)
*G02B 3/00* (2006.01)
*G02B 7/02* (2021.01)

(52) U.S. Cl.
CPC ............. *G09G 3/32* (2013.01); *G02B 3/0037* (2013.01); *G02B 7/02* (2013.01); *G09G 2300/0439* (2013.01); *G09G 2330/021* (2013.01)

(58) Field of Classification Search
None
See application file for complete search history.

(56) References Cited

U.S. PATENT DOCUMENTS 7,924,327 B2 * 4/2011 Nagashima ....... H01L 27/14625
348/239
8,928,969 B2   1/2015 Alpaslan et al.
(Continued)

FOREIGN PATENT DOCUMENTS

GB   2405543 A   3/2005
WO   2020240106 A1   12/2020

OTHER PUBLICATIONS

International Search Report dated Sep. 30, 2020 re: Application No. PCT/FR2020/050756, pp. 1-2, citing: Tai-Hsiang Jen et al., US 2004041747 A1 and GB 2405543 A.

(Continued)

*Primary Examiner* — Ryan M Gray
(74) *Attorney, Agent, or Firm* — CANTOR COLBURN LLP

(57) ABSTRACT

An optoelectronic device having a set of pixels wherein each pixel has a sub-pixel capable of emitting a primary light beam, a set of pixels each pixel being adjacent to a pixel wherein each secondary pixel has at least one secondary sub-pixel capable of emitting a secondary light beam, a set of optical systems arranged so as to be able to cover an entire pixel belonging to one of the sets and at least part of the sub-pixels of at least one of the adjacent pixels belonging to the other set, the number of pixels being greater than twice the number of optical systems. At least one movement mechanism applies a relative movement between the set and the sets according to a predetermined sequence.

18 Claims, 3 Drawing Sheets

(56) References Cited

U.S. PATENT DOCUMENTS

| | | | |
|---|---|---|---|
| 10,200,673 B2* | 2/2019 | Massaru Amemiya | ....................... H04N 13/282 |
| 2004/0041747 A1 | 3/2004 | Uehara et al. | |
| 2005/0134699 A1* | 6/2005 | Nagashima | .......... H04N 23/687 348/E5.045 |
| 2006/0061846 A1 | 3/2006 | Sprague et al. | |
| 2007/0091037 A1 | 4/2007 | Lee | |
| 2011/0096071 A1* | 4/2011 | Okamoto | ............. H04N 13/305 345/419 |
| 2012/0154920 A1 | 6/2012 | Harrison et al. | |
| 2015/0370064 A1* | 12/2015 | Eguchi | ................. G02B 3/0068 359/619 |
| 2022/0210393 A1* | 6/2022 | Joo | ...................... H04N 13/271 |

OTHER PUBLICATIONS

Tai-Hsiang Jen et al., "Dynamic integral imaging display with electrically moving array lenslet technique using liquid crystal lens", Optics Express, Jul. 7, 2015, vol. 23, No. 14, pp. 18415, pp. 1-7, XP055666631.

* cited by examiner

OPTOELECTRONIC DEVICE HAVING OPTICAL SYSTEMS THAT CAN BE MOVED BETWEEN DIFFERENT PIXELS, AND CONTROL METHOD

TECHNICAL FIELD

The present disclosure concerns an optoelectronic device configured to emit light, in particular to display an image, or to capture light, the optoelectronic device comprising:
- at least one set of primary pixels where each primary pixel is arranged on a free surface of a substrate and comprises at least one primary sub-pixel each capable of emitting a primary light beam on the side opposite to the substrate,
- at least one set of secondary pixels where the secondary pixels are arranged on the free surface of the substrate alternately with the primary pixels so that each primary pixel is adjacent to at least one secondary pixel and each secondary pixel comprises at least one secondary sub-pixel capable of emitting a secondary light beam on the side opposite to the substrate.

The disclosure also concerns an image display system comprising such an optoelectronic device.

The disclosure also concerns a method for controlling such an optoelectronic device.

The disclosure finds an application in particular in display screens, image projection or image acquisition systems, for example in the context of a virtual reality screen, a smart phone screen or of a display screen, in particular of three-dimensional images, or of an image capture camera, in particular of three-dimensional images.

BACKGROUND

The term «optoelectronic device» means here a device suitable for converting an electrical signal into electromagnetic radiation to be emitted, in particular light, or adapted to capture light and convert it into an electrical signal.

There are such optoelectronic devices including a set of pixels capable of emitting light in order to display images or conversely capable of capturing external light as part of capturing images.

The pixels can emit light beams most often multicolored thanks to light-emitting diodes also known by the acronym LED for «light-emitting diode», formed on a substrate. The light-emitting diodes generally emit a monochrome light beam. It is possible to keep and directly use the color of the light emitted by the light-emitting diodes, or to convert the light so as to change colors, for example using color converters. To make a multicolored pixel, the light-emitting diodes emitting the same color are therefore grouped together within a sub-pixel which will de facto emit a light beam of the same color as the light-emitting diodes. The other sub-pixels intended to emit according to other colors can make use of such color converters. A pixel composed of several sub-pixels emitting light beams of different colors may therefore appear to emit a multicolored light beam, the color of which varies according to the selection of the active sub-pixels. If the LEDs are nanowires or three-dimensional structures, each sub-pixel can for example contain up to 100,000 light-emitting diodes based on nanowires or three-dimensional structures of a micrometric or nanometric size.

It is known that each light-emitting diode comprises an active material which may or may not use quantum wells, a semiconductor portion doped according to a first type of doping to act as a P-doped junction and a semiconductor portion doped according to a second type of doping to act as an N-doped junction.

Each light-emitting diode can be formed on the basis of three-dimensional or planar, micrometric or even nanometric semiconductor elements.

The current trend is to see the definition of screens or cameras increase, but this leads to real difficulties to be overcome. One of them is that the dimensions between the sub-pixels and the dimensions of each sub-pixel become micrometric, even nanometric, and the use of wired three-dimensional light-emitting diodes becomes inevitable with ever smaller diameters of wired three-dimensional light-emitting diodes. However, the light intensity emitted by nanometric wired light-emitting diodes decreases drastically as the size of wired light-emitting diodes is reduced.

In addition, the light emitted by a wired three-dimensional diode is not focused and, on the contrary, has an emission in all directions of space.

For applications such as augmented reality or virtual reality, the light emitted by the micro displays must be injected into waveguides. To have an effective coupling with waveguides, the light emitted by the used screens or micro screens must be directional. Also, in screens for three-dimensional vision using the emission of different angles of view in different directions (a type of screen called «light field»), the use of an optic covering several pixels to send different angles of view in different directions causes a drop of the screen resolution.

A drawback of the current solutions implemented to improve the directivity of these light beams is that their size is limited to the size of a pixel, which in particular reduces the overall light efficiency of the device.

Applications may also require the emitted light beams to be directional, which is therefore difficult to achieve using only light-emitting diodes.

A known solution consists in forming light containment walls capable of rectifying the light radiation emitted by at least one light-emitting diode.

However, this known technique has the drawback of not focusing precisely the light emitted by each light-emitting diode. The direction of focus is also not dynamically adjustable.

Another drawback is that a large quantity of the light beams emitted by the light-emitting diodes is absorbed by the solutions implemented for the adjustment of their directivity.

Another difficulty is that the focusing of light beams emitted by a sub-pixel becomes more and more difficult as the size of the sub-pixels becomes micrometric or even nanometric.

Another difficulty lies in the persistent display of what looks like a static grid, due to the spacing between the pixels, when a user looks at the images of an optoelectronic device having static focusing means. This effect, known under the name of «Screen door effect» or «fixed pattern noise», is problematic because it induces visual inconvenience for the user.

In the field of the display of three-dimensional images which do not require specific glasses, each angle of view of the same object may require the use of a pixel. So, in a single three-dimensional image of this kind, a point of the displayed three-dimensional image mobilizes up to 25 pixels each symbolizing an angle of view of an object of the image to be displayed. The resolution of the three-dimensional image is therefore drastically reduced.

The same problems are likely to arise for reverse operation in the context of an optoelectronic device intended to capture light.

In particular, in the field of three-dimensional image capture cameras, to capture a maximum of angles of view of the object of the image, it is necessary to have pixels capable of capturing light and transforming it into an electrical signal for each angle of view. It is then necessary to have several pixels for a single three-dimensional image, for example up to 25 pixels, which drastically reduces the resolution of the camera.

SUMMARY

The present disclosure provides an optoelectronic device of the aforementioned type, which responds to all or some of the problems presented above.

In particular, one goal is to provide a solution meeting at least one of the following objectives:
improving the focusing and/or directivity of the light emitted by each pixel;
improving the light efficiency of the optoelectronic device;
reducing or even eliminating the optical grid effect;
improving the display or capture resolution of images, in particular three-dimensional images.

This goal can be achieved by means of an optoelectronic device configured to emit light, in particular to display images, or to capture light, the optoelectronic device comprising:
at least one set $\{A_i\}$ of primary pixels ($A_i$) where each primary pixel ($A_i$) is arranged on a free surface of a substrate and comprises at least one primary sub-pixel $A_{i\beta}$ capable of emitting a primary light beam on the side opposite to the substrate,
at least one set $\{B_i\}$ of secondary pixels $B_i$ where the secondary pixels $B_i$ are arranged on the free surface of the substrate alternately with the primary pixels $A_i$ so that each primary pixel $A_i$ is adjacent to at least one secondary pixel $B_i$ and each secondary pixel $B_i$ comprises at least one secondary sub-pixel $B_{i\beta}$ capable of emitting a secondary light beam on the side opposite to the substrate,
a set $\{C_i\}$ of optical systems $C_i$ where each optical system $C_i$ is arranged so as to be able to cover, on the side opposite to the substrate, both the entirety of a pixel $A_i$, $B_i$ belonging to one of the sets $\{A_i\}$, $\{B_i\}$ of pixels selected from the set $\{A_i\}$ of primary pixels $A_i$ and the set $\{B_i\}$ of secondary pixels $B_i$ and at least part of sub-pixels $A_{i\beta}$, $B_{i\beta}$ of at least one of the adjacent pixels $A_i$, $B_i$ belonging to the other of the sets $\{A_i\}$, $\{B_i\}$ of pixels, each optical system $C_i$ being configured to act optically on all or part of the light beams likely to be emitted by the sub-pixels $A_{i\beta}$, $B_{i\beta}$ belonging to the pixels $A_i$, $B_i$ that it covers, the total number of pixels $A_i$, $B_i$ of the sets $\{A_i\}$, $\{B_i\}$ of primary and secondary pixels $A_i$, $B_i$ being greater or equal to twice the number of optical systems $C_i$ contained in the set $\{C_i\}$ of optical systems $C_i$,
at least one displacement mechanism making it possible to apply a relative movement between the set $\{C_i\}$ of optical systems $C_i$ and the sets $\{A_i\}$, $\{B_i\}$ of pixels $A_i$, $B_i$ in a predetermined sequence.

Some preferred, but non-limiting, aspects of the optoelectronic device are as follows.

In one implementation of the optoelectronic device, said at least one displacement mechanism acts on at least one element selected from the group comprising the set $\{C_i\}$ of optical systems $C_i$, the set $\{A_i\}$ of primary pixels $A_i$ and the set $\{B_i\}$ of secondary pixels $B_i$, in such a way that each optical system $C_i$ is likely to occupy:
a first position in which the optical system $C_i$ simultaneously covers all of the primary sub-pixels $A_{i\beta}$ of one of the primary pixels $A_i$ and part of the secondary sub-pixels $B_{i\beta}$ of at least one of the adjacent secondary pixels $B_i$,
a second position in which the optical system $C_i$ simultaneously covers all of the secondary sub-pixels $B_{i\beta}$ of one of the secondary pixels $B_i$ and part of the primary sub-pixels $A_{i\beta}$ of at least one of the adjacent primary pixels $A_i$, the predetermined sequence passing through a controlled variation between the first position and second position.

In one implementation of the optoelectronic device, each of the primary and secondary pixels $A_i$, $B_i$ is likely to adopt a first light configuration in which all of the sub-pixels $A_{i\beta}$, $B_{i\beta}$ which compose it emit a light beam and in which each optical system $C_i$ is likely to occupy either the first position when the primary pixel $A_i$ which it covers adopts the first light configuration, or the second position when the secondary pixel $B_i$ which it covers adopts the first light configuration.

In one implementation of the optoelectronic device, said at least one displacement mechanism acts on at least one element selected from the group comprising the set $\{C_i\}$ of optical systems $C_i$, the set $\{A_i\}$ of primary pixels $A_i$ and the set $\{B_i\}$ of secondary pixels $B_i$, in such a way that each optical system $C_i$ is likely to occupy a third position in which the optical system $C_i$ simultaneously covers part of the primary sub-pixels $A_{i\beta}$ of one of the primary pixels $A_i$ and part of the secondary sub-pixels $B_{i\beta}$ of at least one of the adjacent secondary pixels $B_i$, the predetermined sequence passing through a controlled variation between the first position, the second position and the third position.

In one implementation of the optoelectronic device, each of the primary and secondary pixels $A_i$, $B_i$ is likely to adopt a second light configuration in which part of the sub-pixels $A_{i\beta}$, $B_{i\beta}$ which compose it, emit a light beam and in which each optical system $C_i$ is likely to occupy the third position when at least one of the primary pixels $A_i$ and at least one of the secondary pixels $B_i$ which it covers while occupying the third position simultaneously adopt the second light configuration, at least one of the primary sub-pixels $A_{i\beta}$ and at least one of the secondary sub-pixels $B_{i\beta}$ covered by the optical system $C_i$ occupying the third position emitting a light beam.

In one implementation of the optoelectronic device, the predetermined sequence provides a frequency f for the alternations between the first light configuration and the second light configuration, and for the displacements of each optical system $C_i$ from one among the first and second positions towards the third position, expressed in Hz, verifying the formula f≥24*n where n is the number of possible translational movements of the optical system $C_i$ by said at least one displacement mechanism.

In one implementation of the optoelectronic device, said at least one displacement mechanism comprises piezoelectric actuators and/or micro-actuators such as piezoelectric materials and/or electroactive polymers and/or shape memory alloys and/or magnetic actuators.

In one implementation of the optoelectronic device, each optical system $C_i$ comprises an optical lens configured so as to be traversed by at least part of the light beams likely to be emitted by the primary and secondary sub-pixels $A_{i\beta}$, $B_{i\beta}$ that it covers while ensuring their optical transformation in order to emit at the output a transformed light beam at least in part made directional in a main direction D1, D2.

In one implementation of the optoelectronic device, the optoelectronic device comprises at least one collimation angle changing element configured to act on at least one of the optical systems $C_i$ so as to selectively place its optical lens among a plurality of distinct optical configurations, the angle formed between the main direction D1, D2 and the substrate varying from an optical configuration to another optical configuration.

In one implementation of the optoelectronic device, the collimation angle changing element comprises piezoelectric elements in the optical lens and/or micro-actuators such as piezoelectric materials and/or electroactive polymers and/or shape memory alloys and/or magnetic actuators and/or actuatable liquid crystals as the optical lens incorporates.

In one implementation of the optoelectronic device, at least one among said at least one displacement mechanism and said at least one collimation angle changing element is configured to act on the optical system $C_i$ so that the optical system $C_i$ is displaced at least partly transversely on the free surface of the substrate.

In one implementation of the optoelectronic device, at least one among said at least one displacement mechanism and said at least one collimation angle changing element is configured to act on the optical system $C_i$ so that the optical system $C_i$ is displaced at least in part generally parallel to the free surface of the substrate.

In one implementation of the optoelectronic device, within the set $\{C_i\}$ of optical systems $C_i$, all the optical systems $C_i$ are linked together so as to form a monolithic unitary assembly within which each optical system $C_i$ is fixed with respect to all the other optical systems $C_i$.

In one implementation of the optoelectronic device, the optical lens is configured to define a convex surface receiving at least one of the primary light beams or at least one of the secondary light beams and a flat surface through which the transformed beam is emitted.

In one implementation of the optoelectronic device, the light beams of the primary sub-pixels $A_{i\beta}$ composing the primary pixel $A_i$ together form a primary emissive surface whose area is measured in a plane parallel to the free surface of the substrate is different from an area representing the spatial extension, measured in the same plane parallel to the free surface of the substrate, of the set of primary sub-pixels $A_{i\beta}$ composing the primary pixel $A_i$, or the light beams of the primary sub-pixels $B_{i\beta}$ composing the secondary pixel $B_i$ together form a primary emissive surface whose area measured in the same plane parallel to the free surface of the substrate is different from an area representing the spatial extension, measured in the same plane parallel to the free surface of the substrate, of all the secondary sub-pixels $B_{i\beta}$ composing the secondary pixel $B_i$.

In one implementation of the optoelectronic device, each optical lens of at least two adjacent optical systems $C_i$, $C_{i+1}$ defines at least one polygonal shape and the optical lenses of the two adjacent optical systems $C_i$, $C_{i+1}$ are contiguous along at least one face of the polygonal shape.

The disclosure also relates to the implementation of an image display system comprising:
- at least one such optoelectronic device,
- at least one graphic calculator capable of calculating images to be displayed by the optoelectronic device and transmitting said images to be displayed to the optoelectronic device, the graphic calculator being configured to calculate at least one set of images to be displayed successively comprising n+1 images to be successively displayed, the set of images to be successively displayed comprising an image to be displayed comprising data relating to the set $\{A_i\}$ of primary pixels $A_i$ and n images to be displayed comprising data relating to the n set $\{B_i\}$ of primary pixels $B_i$ corresponding to n displacements of the set $\{C_i\}$ of optical systems $C_i$, each image to be displayed being transmitted to the optoelectronic device by the graphic calculator synchronously with each displacement of the set $\{C_i\}$ of optical systems $C_i$.

The disclosure also relates to the implementation of a method for controlling an optoelectronic device configured to emit light, in particular to display images, or to capture light, in which the optoelectronic device comprises:
- at least one set $\{A_i\}$ of primary pixels $A_i$ where each primary pixel $A_i$ is arranged on a free surface of a substrate and comprises at least one primary sub-pixel $A_{i\beta}$ capable of emitting a primary light beam on the side opposite the substrate,
- at least one set $\{B_i\}$ of secondary pixels $B_i$ where the secondary pixels $B_i$ are arranged on the free surface of the substrate alternately with the primary pixels $A_i$ so that each primary pixel $A_i$ is adjacent to at least one secondary pixel $B_i$ and each secondary pixel $B_i$ comprises at least one secondary sub-pixel $B_{i\beta}$ capable of emitting a secondary light beam on the side opposite the substrate,
- a set $\{C_i\}$ of optical systems $C_i$ where each optical system $C_i$ is arranged so as to be able to cover, on the side opposite to the substrate, both the entirety of a pixel $A_i$, $B_i$ belonging to one of the sets $\{A_i\}$, $\{B_i\}$ of pixels selected from the set $\{A_i\}$ of primary pixels $A_i$ and the set $\{B_i\}$ of secondary pixels $B_i$ and at least part of the sub-pixels $A_{i\beta}$, $B_{i\beta}$ of at least one of the adjacent pixels $A_i$, $B_i$ belonging to the other of the sets $\{A_i\}$, $\{B_i\}$ of pixels, each optical system $C_i$ being configured to act optically on all or part of the light beams likely to be emitted by the sub-pixels $A_{i\beta}$, $B_{i\beta}$ belonging to the pixels $A_i$, $B_i$ it covers, the total number of pixels $A_i$, $B_i$ of the sets $\{A_i\}$, $\{B_i\}$ of primary and secondary pixels $A_i$, $B_i$ being greater or equal to twice the number of optical systems $C_i$ contained in the set $\{C_i\}$ of optical systems $C_i$,
- at least one displacement mechanism making it possible to apply a sequential relative movement between the set $\{C_i\}$ of optical systems $C_i$ and the sets $\{A_i\}$, $\{B_i\}$) of pixels $A_i$, $B_i$ in a predetermined sequence, the controlling method comprising, for the implementation of said predetermined sequence, a phase periodically repeated overtime and comprising the following steps:

a) controlling said at least one displacement mechanism so as to place each optical system $C_i$ in a first position in which the optical system $C_i$ simultaneously covers all of the primary sub-pixels $A_{i\beta}$ of one of the primary pixels $A_i$ and part of the secondary sub-pixels $B_{i\beta}$ of at least one of the adjacent secondary pixels $B_i$ or in a second position in which the optical system $C_i$ simultaneously covers the whole secondary sub-pixels $B_{i\beta}$ of one of the secondary pixels $B_i$ and part of the primary sub-pixels $A_{i\beta}$ of at least one of the adjacent primary pixels $A_i$, b) acting on the primary pixel $A_i$ or the secondary pixel $B_i$ whose all the sub-pixels $A_{i\beta}$, $B_{i\beta}$ are covered by the optical system $C_i$ following the step a) so as to place it in a first light configuration in which all of the sub-pixels $A_{i\beta}$, $B_{i\beta}$ which compose it, emit a light beam, c) controlling said at least one displacement mechanism in a manner allowing each optical system $C_i$ to be displaced to place it either in the second position if the optical system $C_i$ occupied the first position following step a), or in the first position if the optical system $C_i$ occupied the second position following step a), or in a third position in which the optical system $C_i$ simultaneously covers part of the primary sub-pixels $A_{i\beta}$ of one of the primary pixels $A_i$ and part of the secondary sub-pixels $B_{i\beta}$ of at least one of the adjacent secondary pixels $B_i$, d) acting either on the primary pixel $A_i$ or the secondary pixel $B_i$ whose all the sub-pixels $A_{i\beta}$, $B_{i\beta}$) are covered by the optical system $C_i$ following step c) so as to place it in the first light configuration in which all of the sub-pixels $A_{i\beta}$, $B_{i\beta}$ which compose it emit a light beam, or at the same time on at least one primary pixel $A_i$ whose primary sub-pixels $A_{i\beta}$ are covered by the optical system $C_i$ following step c) so as to place it in a second light configuration in which at least one of the primary sub-pixels $A_{i\beta}$ covered by the optical system $C_i$ emits a light beam and on at least one secondary pixel $B_i$ whose secondary sub-pixels $B_{i\beta}$ are covered by the optical system $C_i$ following step c) so as to place it in a second light configuration in which at least one of the secondary sub-pixels $B_{i\beta}$ covered by the optical system $C_i$ emits a light beam.

In one implementation of the method, each optical system $C_i$ comprises an optical lens configured so as to be traversed by at least part of the light beams likely to be emitted by the primary and secondary sub-pixels $A_{i\beta}$, $B_{i\beta}$ which it covers by ensuring their optical transformation in order to emit at the output a transformed light beam at least in part made directional in a main direction D1, D2 and in which the optoelectronic device comprises at least one collimation angle changing element configured to act on at least one of the optical systems $C_i$ so as to selectively place its optical lens among a plurality of distinct optical configurations where the angle formed between the main direction D1, D2 and the substrate varies from an optical configuration to another optical configuration, the controlling method being such that the phase comprises a step e), implemented before step c), consisting in actuating the collimation angle changing element so as to vary the angle formed between the main direction D1, D2 and the substrate at least once so as to place the optical lens successively in at least two distinct optical configurations.

BRIEF DESCRIPTION OF THE DRAWINGS

Other aspects, aims, advantages and characteristics of the disclosure will emerge better on reading the following detailed description of preferred embodiments thereof, given by way of non-limiting example, and made in reference to the accompanying drawings in which.

DETAILED DESCRIPTION OF THE DRAWINGS

In the figures and in the remainder of the description, the same references represent identical or similar elements. In addition, the various elements are not represented to scale so as to favor the clarity of the figures. Furthermore, the different embodiments, examples and variants are not mutually exclusive and can be combined with one another.

Figure 1:
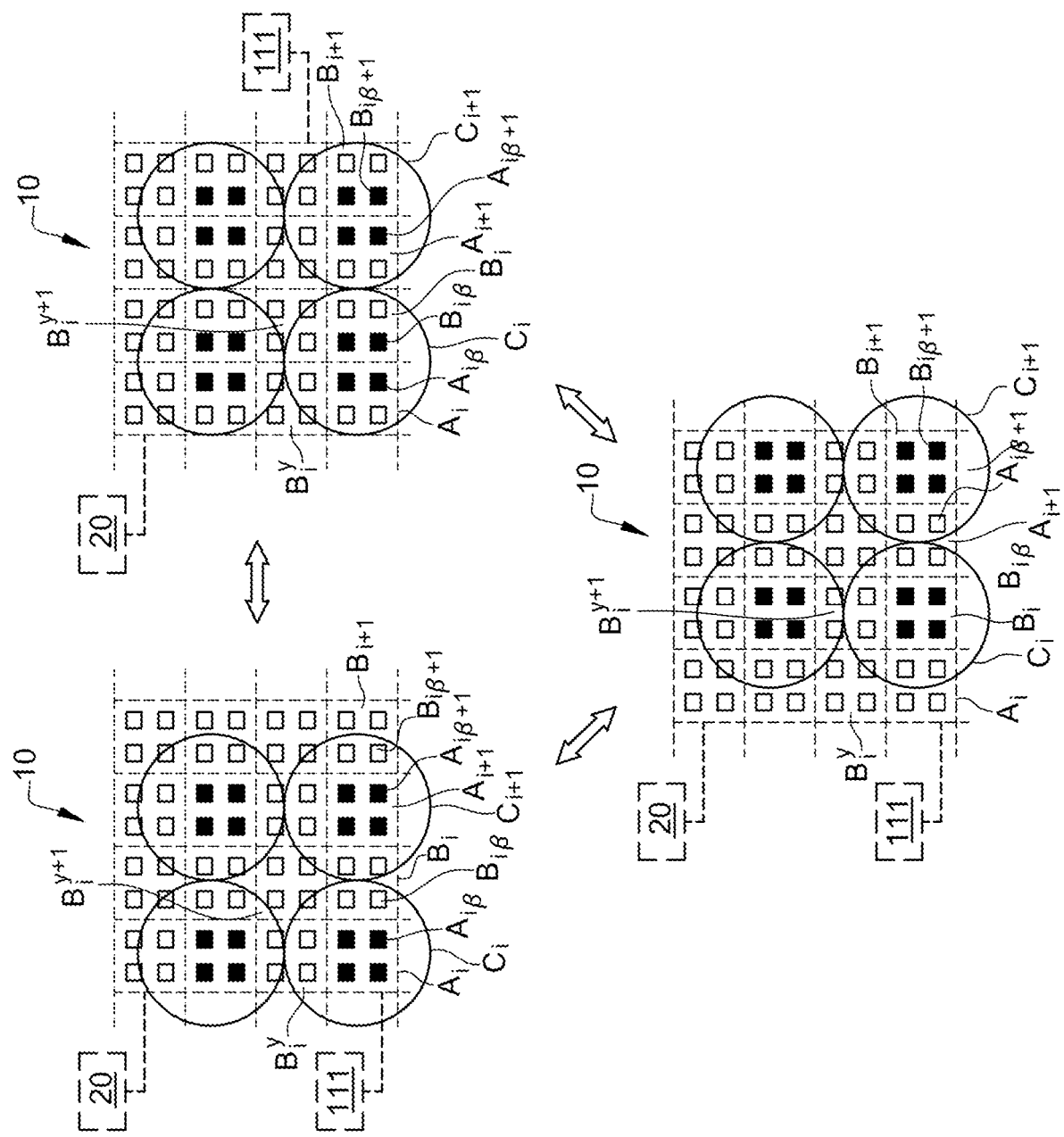
FIG. 1 is a schematic top view of different configurations of a set $\{A_i\}$ of primary pixels $A_i$, of a set $\{B_i\}$ of secondary pixels $B_i$ and of a set $\{C_i\}$ of optical systems (C) of an optoelectronic device according to the disclosure.
Figure 2:
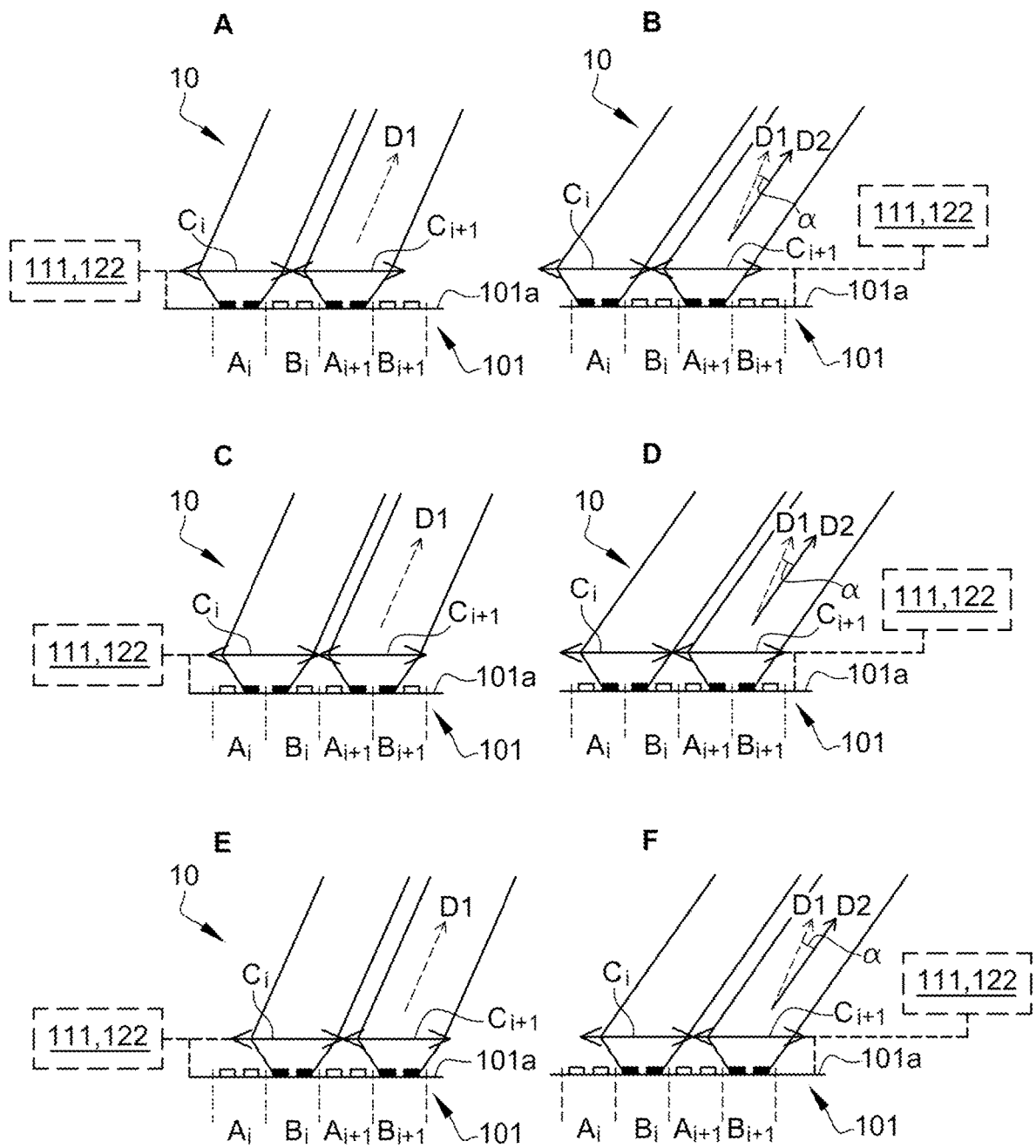
FIG. 2 is a schematic sectional view of different configurations of a set $\{A_i\}$ of primary pixels $A_i$, of a set $\{B_i\}$ of secondary pixels $B_i$ and of a set $\{C_i\}$ of optical systems (C) of an optoelectronic device according to the disclosure.

As illustrated in FIGS. 1 and 2, the disclosure relates to an optoelectronic device 10 configured to emit light, in particular to display images, or to capture light.

The optoelectronic device 10 comprises at least one set $\{A_i\}$ of primary pixels $A_i$ where each primary pixel $A_i$ is arranged on a free surface 101a of a substrate 101 and comprises at least one primary sub-pixel $A_{i\beta}$ capable of emitting a primary light beam on the side opposite to the substrate 101. The set $\{A_i\}$ can be organized in a two-dimensional matrix, or even in a three-dimensional non-represented way-, where the rows and columns are respectively indexed for example with the indices i and y.

The substrate 101 can for example be formed in a semiconductor material but also in an insulating or conductive material. The substrate 101 also comprises all or part of the electronic connections for supplying the pixels and other components necessary to control the optoelectronic device. The substrate 101 and the electronic power supply components being well known to those skilled in the art, they will not be described here.

The term «sub-pixel» means a device capable of emitting light or collecting light. Each sub-pixel can for example include one or more plane or three-dimensional light-emitting diodes having dimensions in the range of a millimeter up to a few tens of nanometers. Liquid crystal sub-pixels are for example also usable. Several sub-pixels each capable of generating at least one color different from its neighbor(s) (generally red, green, blue, yellow) can be arranged within a pixel so that their combined emission forms a color resulting from the sum of the colors of each sub-pixel and their respective intensity or the temporal frequency of emission of each sub-pixel.

The optoelectronic device 10 also comprises at least one set $\{B_i\}$ of secondary pixels $B_i$. The secondary pixels $B_i$ are arranged on the free surface 101a of the substrate 101 alternately with the primary pixels $A_i$ such that each primary pixel $A_i$ is adjacent to at least one secondary pixel $B_i$. Each secondary pixel $B_i$ comprises at least one secondary sub-pixel $B_{i\beta}$ capable of emitting a secondary light beam on the side opposite to the substrate 101. The secondary sub-pixels $B_{i\beta}$ are advantageously formed in the same way and are of the same nature as the primary sub-pixels $A_{i\beta}$.

The term «side opposite to the substrate» means, as illustrated in FIG. 2, that the light beams are emitted upwards into the free space not delimited by the substrate.

The optoelectronic device 10 also comprises a set $\{C_i\}$ of optical systems $C_i$ where each optical system $C_i$ is arranged, as illustrated for example in FIGS. 1 and 2, so as to be able to cover, on the side opposite to the substrate 101, both the entirety of a pixel $A_i$, $B_i$ belonging to one of the sets $\{A_i\}$, $\{B_i\}$ of pixels selected from the set $\{A_i\}$ of primary pixels $A_i$ and the set $\{B_i\}$ of secondary pixels $B_i$ and at least part of the sub-pixels $A_{i\beta}$, $B_{i\beta}$ of at least one of the adjacent pixels $A_i$, $B_i$ belonging to the other of the sets $\{A_i\}$, $\{B_i\}$ of pixels.

Each optical system $C_i$ is configured to act optically on all or part of the light beams likely to be emitted by the sub-pixels $A_{i\beta}$, $B_{i\beta}$ belonging to the pixels $A_i$, $B_i$ that it covers, the total number of pixels $A_i$, $B_i$ of the sets $\{A_i\}$, $\{B_i\}$ of primary and secondary pixels $A_i$, $B_i$ being greater than or equal to two times the number of optical systems $C_i$ contained in the set $\{C_i\}$ of optical systems $C_i$. In an example illustrated in FIG. 1, the same optical system $C_i$ initially covers an entire pixel $A_i$, that is to say all of these sub-pixels $A_{i\beta}$, as well as sub-pixels $B_i^\gamma$ of an adjacent pixel located higher on a column of pixels. It also covers sub-pixels $B_{i\beta}$ of an adjacent pixel. The optical system $C_i$ can thus optically act, in one example, on all these elements in a global manner or, in another example as explained further below in a sequential manner and/or individually for each concerned sub-pixel and sequentially.

In another example, the optical system $C_i$ can be more extensive and initially cover several consecutive pixels or sub-pixels as much in the direction of the columns of the pixel matrix as in the direction of the rows.

The different optical systems $C_i$ can be adjacent as described here in FIGS. 1 and 2 but they can also be, in another example, non-adjacent, in other words not contiguous.

In another example, the optical systems $C_i$ are circular in shape.

Figure 4:
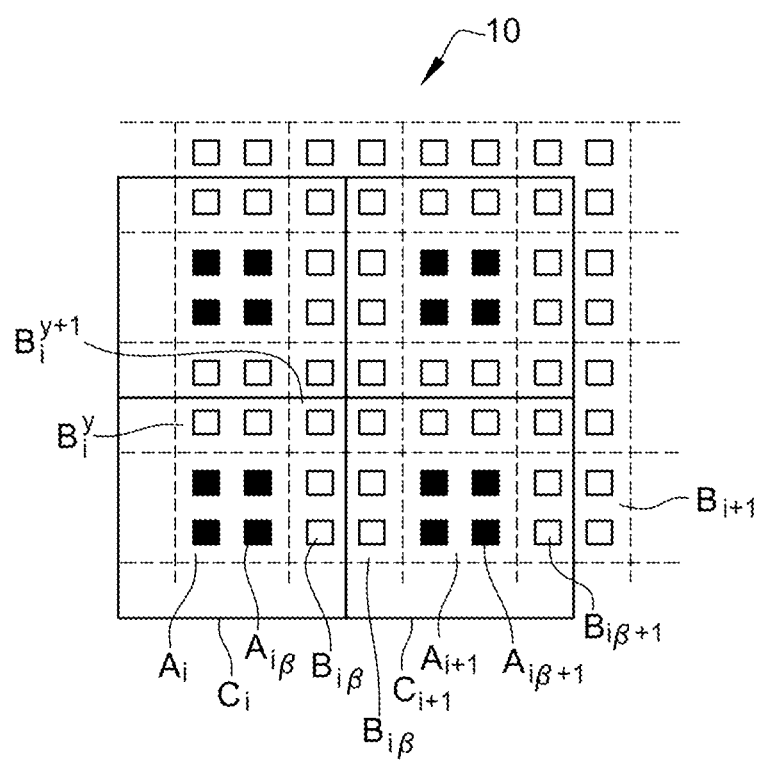
FIG. 4 is a schematic top view of an example of an assembly $\{C_i\}$ of optical systems (C) of an optoelectronic device according to the disclosure.

In another example illustrated in FIG. 4, the optical systems $C_i$ have a polygonal shape, for example square or rectangular shape. This makes it possible to limit the spaces left free between the optical system $C_i$ and this makes it possible to limit the displacements and increase the precision. This example also makes it possible to increase the lightness of the device because a maximum of emitted light beams is thus used.

In one example, the optical systems $C_i$ are able to collimate the light beam coming from each sub-pixel. This advantageously makes it possible to provide a directional light at the output of the optoelectronic device 10. This example also makes it possible to increase the lightness because a maximum of the light emitted by the sub-pixels is directed in the same direction.

In another example, the optical systems $C_i$ are able to focus the light beam coming from each sub-pixel. This can be useful for increasing the intensity at the output of the optoelectronic device 10.

According to the examples, the optical system $C_i$ may be required to perform for example several consecutive movements in order to coverall the pixels and sub-pixels on which it must optically act.

The more the optical systems $C_i$ are spaced, the more they must undergo movements to coverall the pixels and sub-pixels with which they must interact optically and the more they must have a high displacement frequency in order to be able to sequentially cover the various pixels and sub-pixels concerned and possibly return to their starting point and then start again for a new predetermined sequence.

The optoelectronic device 10 thus also comprises at least one displacement mechanism 111 making it possible to apply a relative movement between the set $\{C_i\}$ of optical systems $C_i$ and the sets $\{A_i\}$, $\{B_i\}$ of pixels $A_i$, $B_i$ according to a predetermined sequence.

The relative displacements of each optical system $C_i$ with respect to the sets $\{A_i\}$, $\{B_i\}$ of pixels $A_i$, $B_i$ can be united or two-dimensional depending on the columns and rows of the pixel matrix. An optical system $C_i$ can thus perform, for example, $k^2$ displacements where k is the number of different pixels to be covered according to a two-dimensional pixel matrix during a predetermined sequence.

In one example, at least one displacement mechanism 111 comprises piezoelectric actuators and/or micro actuators such as piezoelectric materials and/or electroactive polymers and/or shape memory alloys and/or magnetic actuators. These actuators can be controlled in a manner known to those skilled in the art.

An advantage of such an optoelectronic device is that the light emitted by the different pixels is not lost because the emitted light beams mostly interact with the systems $C_i$ since these are wider than the pixels $A_i$, $B_i$.

Such an optoelectronic device 10 makes it possible to increase the light intensity at the output of the optoelectronic device 10. Another advantage is that it makes it possible to eliminate parasitic lights and to limit power consumption.

Such a device can for example be used to obtain an optoelectronic device emitting directional light beams, which can be advantageous for increasing viewing security or even allowing use in virtual reality or three-dimensional vision masks.

In an exemplary embodiment illustrated in FIGS. 1 and 2, said at least one displacement mechanism 111 acts on at least one element selected from the group comprising the set $\{C_i\}$ of optical systems $C_i$, the set $\{A_i\}$ of primary pixels $A_i$ and the set $\{B_i\}$ of secondary pixels $B_i$, in such a way that each optical system $C_i$ is likely to occupy:

a first position in which the optical system $C_i$ simultaneously covers all of the primary sub-pixels $A_{i\beta}$ of one of the primary pixels $A_i$ and part of the secondary sub-pixels $B_{i\beta}$ of at least one of the adjacent secondary pixels $B_i$, a second position in which the optical system $C_i$ simultaneously covers all of the secondary sub-pixels $B_{i\beta}$ of one of the secondary pixels $B_i$ and part of the primary sub-pixels $A_{i\beta}$ of at least one of the adjacent primary pixels $A_i$, the predetermined sequence passing through a controlled variation between the first position and the second position.

FIG. 2 show examples of sub-sequences, for example A, C and E of a predetermined sequence between which the relative movement of each optical system $C_i$ with respect to the sets $\{A_i\}$, $\{B_i\}$ of pixels $A_i$, $B_i$ allows the different optical systems $C_i$ of alternately covering the pixels of the set $\{A_i\}$ then one or more sub-pixels $A_{i\beta}$ and one or more sub-pixels $B_{i\beta}$ and then the pixels of the set $\{B_i\}$ in order to interact optically with their emitted light beam.

Such an optoelectronic device 10 makes it possible to increase the light intensity. Another advantage is that it eliminates parasitic lights and limits power consumption.

In an exemplary implementation of the optoelectronic device 10, each of the primary and secondary pixels $A_i$, $B_i$ is likely to adopt a first light configuration in which all of the sub-pixels $A_{i\beta}$, $B_{i\beta}$ which compose it, emit a light beam and in which each optical system $C_i$ is likely to occupy either the first position when the primary pixel $A_i$ which it covers adopts the first light configuration, or the second position when the secondary pixel $B_i$ which it covers adopts the first light configuration.

The ghost images are thus advantageously eliminated since the pixels and/or sub-pixels are alternately off. the power consumption is also reduced.

In an exemplary implementation illustrated in FIGS. 1 and 2, said at least one displacement mechanism 111 acts on at least one element selected from the group comprising the set $\{C_i\}$ of optical systems $C_i$, the set $\{A_i\}$ of primary pixels $A_i$ and the set $\{B_i\}$ of secondary pixels $B_i$, in such a way that each optical system $C_i$ is likely to occupy a third position in which the optical system $C_i$ simultaneously covers part of the primary sub-pixels $A_{i\beta}$ of one of the primary pixels $A_i$ and part of the secondary sub-pixels $B_{i\beta}$ of at least one adjacent secondary pixels $B_i$, the predetermined sequence passing through a controlled variation between the first position, the second position and the third position. The power consumption will thus be advantageously reduced and the resolution of the increased images, in particular for displaying three-dimensional images.

In an exemplary implementation illustrated in FIG. 1 and in the sub-sequences C and D of FIG. 2, each of the primary and secondary pixels $A_i$, $B_i$ is likely to adopt a second light configuration in which part of the sub-pixels $A_{i\beta}$, $B_{i\beta}$ which compose it, emit a light beam and in which each optical system $C_i$ is likely to occupy the third position when at least one of the primary pixels $A_i$ and at least one of the secondary pixels $B_i$ which it covers by occupying the third position simultaneously adopt the second light configuration. At least one of the primary sub-pixels $A_{i\beta}$ and at least one secondary sub-pixels $B_{i\beta}$ covered by the optical system $C_i$ occupying the third position, emitting a light beam.

In one example, the predetermined sequence provides a frequency f for the alternations between the first light configuration and the second light configuration, and for the displacements of each optical system $C_i$ from one among the first and second positions to the third position, expressed in Hz, verifying the formula f≥24*n where n is the number of possible translational movements of the optical system $C_i$ by said at least one displacement mechanism 111. The resulting light perception will depend on the recovery rate of each system $C_i$ with respect to each sub-pixel or pixel as well as the nature of the optical interaction between the two (for example collimation) but also of the frequency f. For example, if an optical system $C_i$ acts optically alternately with a blue sub-pixel and an adjacent yellow sub-pixel with a frequency f≥24*2, a color perceived as a mixture of the two colors may emerge that is to say green. Such a displacement frequency f advantageously makes it possible to obtain improved resolution. Indeed, the systems $C_i$ being larger than the primary or secondary pixels, this would reduce the resolution of the optoelectronic device 10. But with such a frequency f, the resolution is increased because the set $\{A_i\}$ of primary pixels $A_i$ and the set $\{B_i\}$ of secondary pixels $B_i$ and their sub-pixels are thus all alternately covered in an invisible manner by the user for whom the resolution is artificially high due to retinal persistence.

In an exemplary implementation of the optoelectronic device 10 illustrated in FIG. 2, each optical system $C_i$ comprises an optical lens configured so as to be traversed by at least part of the light beams likely to be emitted by the primary and secondary $A_{i\beta}$, $B_{i\beta}$ sub-pixels which it covers by ensuring their optical transformation in order to emit at the output a transformed light beam at least in part made directional in a main direction D1, D2.

In an example of this implementation illustrated in FIG. 2, the optoelectronic device 10 comprises at least one collimation angle changing element 122 configured to act on at least one of the optical systems $C_i$ so as to selectively place its optical lens among a plurality of distinct optical configurations. Thus, the angle α formed between the main direction D1, D2 and the substrate 101 varies from one optical configuration to another optical configuration. This configuration advantageously makes it possible to be able to create a three-dimensional image effect with a limited number of pixels or sub-pixels. In an example of this implementation, the number of main directions D1, D2, . . . D25 is greater than 25 due to the action of the collimation angle changing element 122. A quality artificial three-dimensional effect is thus obtained at potentially starting from one pixel or a limited group of sub-pixels. This is different from the state of the art where to obtain the same three-dimensional effect, it would be necessary to successively mobilize and illuminate at least 25 pixels or sub-pixels each having a different emission directionality to be able to create the three-dimensional effect. So, this implementation of the optoelectronic device 10 is particularly advantageous for obtaining a quality three-dimensional visual effect for the user while keeping a preserved display resolution unlike the case of the state of the art where a three-dimensional pixel is formed by at least 25 sub-pixels or 25 directional pixels each forming the directions D1 to D25.

In another implementation of the optoelectronic device 10, the collimation angle changing element 122 comprises piezoelectric elements in the optical lens and/or micro actuators such as piezoelectric materials and/or electroactive polymers and/or shape memory alloys and/or magnetic actuators and/or actuatable liquid crystals that the optical lens incorporates. Those skilled in the art will be able to use their knowledge to implement these elements.

Figure 3:
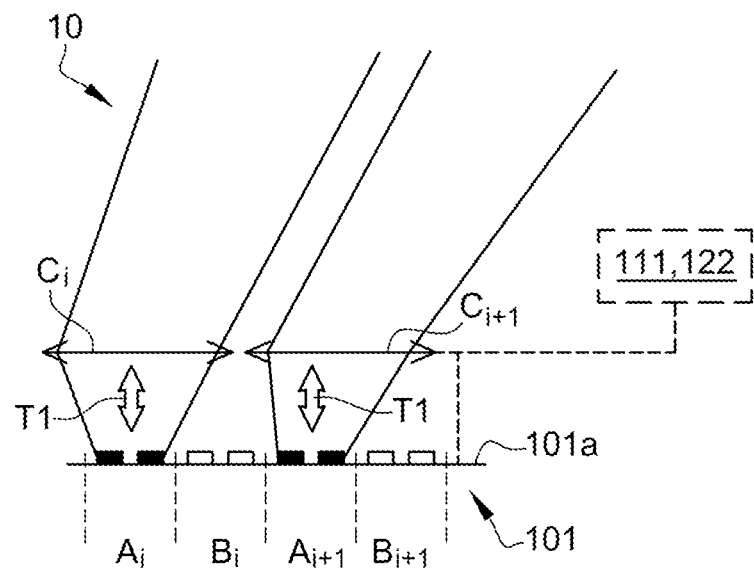
FIG. 3 is a schematic sectional view of different configurations of an assembly $\{C_i\}$ of optical systems (C) of an optoelectronic device according to the disclosure.

In another implementation of the optoelectronic device 10, illustrated in FIG. 3, at least one among said at least one displacement mechanism 111 and said at least one collimation angle changing element 122 is configured to act on the optical system $C_i$ so that the optical system $C_i$ is displaced, as illustrated in FIG. 3, at least partly transversely to the free surface 101a of the substrate 101. This is advantageous in order to be able to change the directionality or the collimation as well as the focusing or the magnification of the light beams from pixels and/or sub-pixels.

In another implementation of the optoelectronic device 10, illustrated in FIG. 2 by the passage, for example between the configurations A and B or C and D or even E and F, by at least one displacement mechanism 111 and said at least a collimation angle changing element 122 is configured to act on the optical system $C_i$ so that the optical system $C_i$ is displaced at least in part generally parallel to the free surface 101a of the substrate 101. This example is advantageous because it makes it possible to vary by the direction or the focusing of a light beam emitted by a pixel or a sub-pixel in a precise and rapid manner while keeping a high display resolution.

In another implementation of the optoelectronic device 10, illustrated in FIGS. 1 and 2, within the set $\{C_i\}$ of optical systems $C_i$, all the optical systems $C_i$ are linked together so as to form a monolithic unitary assembly within which each optical system $C_i$ is fixed with respect to all the other optical systems $C_i$. This implementation is advantageous because it makes it possible to limit the number of displacement mechanisms 111 to be used to displace the set $\{C_i\}$ of optical systems $C_i$. Another advantage is that this makes it possible to consume less energy as well as to increase the speed of movement of the set $\{C_i\}$ of optical systems $C_i$ thus promoting fluidity of display.

In one implementation of the optoelectronic device 10, the optical lens is configured to define a convex surface receiving at least one of the primary light beams or at least one of the secondary light beams and a flat surface through which the transformed beam is emitted.

In an implementation of the optoelectronic device 10, illustrated in FIG. 2, the light beams of the primary sub-pixels $A_{i\beta}$ composing the primary pixel $A_i$ together form a primary emissive surface whose area measured in a plane parallel to the free surface 101a of the substrate is different from an area representing the spatial extension, measured in the same plane parallel to the free surface 101a of the substrate, of all the primary sub-pixels $A_{i\beta}$ composing the primary pixel $A_i$. It can also be the same for the light beams of the primary sub-pixels $B_{i\beta}$ composing the secondary pixel $B_i$ together form a primary emissive surface whose area measured in the same plane parallel to the free surface 101a of the substrate is different from an area representing the spatial extension, measured in the same plane parallel to the free surface 101a of the substrate, of the set of secondary sub-pixels $B_i$ composing the secondary pixel $B_i$. This architecture is obtained when the sub-pixels emit in a non-directional way. Therefore, the use of optical systems $C_i$ is advantageous for acting optically on these divergent beams and making them converge or collimate them, for example, which makes it possible to improve the light intensity, for example in a given direction.

In an implementation of the optoelectronic device 10 illustrated in FIG. 4, each optical lens of at least two adjacent optical systems $C_i$, $C_{i+1}$ defines at least one polygonal shape and the optical lenses of the two adjacent optical systems $C_i$, $C_{i+1}$ are contiguous along at least one face of the polygonal shape.

The disclosure also relates to an image display system comprising:
- at least one such optoelectronic device 10;
- at least one graphic calculator 20 capable of calculating images to be displayed by the optoelectronic device 10 and transmitting said images to be displayed to the optoelectronic device 10, the graphic calculator 20 being configured to calculate at least one set of images to be displayed successively comprising n+1 images to be displayed successively, the set of images to be displayed successively comprising an image to be displayed comprising data relating to the set $\{A_i\}$ of primary pixels $A_i$ and n images to be displayed comprising data relating to the n set $\{B_i\}$ of primary pixels $B_i$ corresponding to n displacements of the set $\{C_i\}$ of optical systems $C_i$, each image to be displayed being transmitted to the optoelectronic device 10 by the graphic calculator synchronously with each movement of the set $\{C_i\}$ of optical systems $C_i$. This display system 20 advantageously makes it possible to display images while eliminating ghost images while maintaining a high graphic resolution. It also achieves smooth three-dimensional images with high graphic resolution without ghost images.

The disclosure also relates to a method for controlling an optoelectronic device configured to emit light, in particular to display images, or to capture light, in which the optoelectronic device 10 comprises:
- at least one set $\{A_i\}$ of primary pixels $A_i$ where each primary pixel $A_i$ is arranged on a free surface 101a of a substrate 101 and comprises at least one primary sub-pixel $A_{i\beta}$ capable of emitting a primary light beam on the side opposite to the substrate 101,
- at least one set $\{B_i\}$ of secondary pixels $B_i$ where the secondary pixels $B_i$ are arranged on the free surface 101a of the substrate 101 alternately with the primary pixels $A_i$ so that each primary pixel $A_i$ is adjacent by at least one pixel secondary $B_i$ and each secondary pixel $B_i$ comprises at least one secondary sub-pixel $B_{i\beta}$ capable of emitting a secondary light beam on the side opposite to the substrate 101,
- a set $\{C_i\}$ of optical systems $C_i$ where each optical system $C_i$ is arranged so as to be able to cover, on the side opposite to the substrate 101, both the whole of a pixel $A_i$, $B_i$ belonging to one of the sets $\{A_i\}$, $\{B_i\}$ of pixels selected from the set $\{A_i\}$ of primary pixels $A_i$ and the set $\{B_i\}$ of secondary pixels $B_i$ and at least part of the sub-pixels $A_{i\beta}$, $B_{i\beta}$ of at least one of the adjacent pixels $A_i$, $B_i$ belonging to the other of the sets $\{A_i\}$, $\{B_i\}$ of pixels, each optical system $C_i$ being configured to act optically on all or part of the light beams likely to be emitted by the sub-pixels $A_{i\beta}$, $B_{i\beta}$ belonging to the pixels $A_i$, $B_i$ that it covers, the total number of pixels $A_i$, $B_i$ of the sets $\{A_i\}$, $\{B_i\}$ of primary and secondary pixels $A_i$, $B_i$ being greater than or equal to twice the number of optical systems $C_i$ contained in the set $\{C_i\}$ of optical systems $C_i$,
- at least one displacement mechanism 111 making it possible to apply a sequential relative movement between the set $\{C_i\}$ of optical systems $C_i$ and the sets $\{A_i\}$, $\{B_i\}$ of pixels $A_i$, $B_i$ in a predetermined sequence.

The controlling method comprises, for the implementation of said predetermined sequence, a phase periodically repeated overtime and comprises the following steps:
a) controlling said at least one displacement mechanism 111 in a manner allowing each optical system $C_i$ to be placed in a first position in which the optical system $C_i$ simultaneously covers all of the primary sub-pixels $A_{i\beta}$ of one of the primary pixels $A_i$ and part of the secondary sub-pixels $B_{i\beta}$ of at least one of the adjacent secondary pixels $B_i$ or in a second position in which the optical system $C_i$ simultaneously covers all of the secondary sub-pixels $B_{i\beta}$ of one of the secondary pixels $B_i$ and part of the primary sub-pixels $A_{i\beta}$ of at least one of the adjacent primary pixels $A_i$,
b) acting on the primary pixel $A_i$ or the secondary pixel $B_i$ whose all the sub-pixels $A_{i\beta}$, $B_{i\beta}$ are covered by the optical system $C_i$ following step a so as to place it in a first light configuration in which all of the sub-pixels $A_{i\beta}$, $B_{i\beta}$ which compose it emit a light beam,
c) controlling said at least one displacement mechanism 111 in a manner allowing each optical system $C_i$ to be displaced to place it either in the second position if the optical system $C_i$ occupied the first position following step a, either in the first position if the optical system $C_i$ occupied the second position following step a, or in a third position in which the optical system $C_i$ simultaneously covers part of the primary sub-pixels $A_{i\beta}$ of one of the primary pixels $A_i$ and part of the secondary sub-pixels $B_{i\beta}$ of at least one of the adjacent secondary pixels $B_i$,
d) acting either on the primary pixel $A_i$ or the secondary pixel $B_i$ whose all the sub-pixels $A_{i\beta}$, $B_{i\beta}$ are covered by the optical system $C_i$ following step c so as to place it in the first light configuration in which all of the sub-pixels $A_{i\beta}$, $B_{i\beta}$ which compose it emit a light beam, or at the same time on at least one primary pixel $A_i$ whose primary sub-pixels $A_{i\beta}$ are covered by the optical system $C_i$ following step c) so as to place it in a second light configuration in which at least one of the primary sub-pixels $A_{i\beta}$ covered by the optical system $C_i$ emits a light beam and on at least one secondary pixel $B_i$ whose secondary sub-pixels $B_{i\beta}$ are covered by the optical system $C_i$ following step c) so as to place it in a second light configuration in which at least one of the secondary sub-pixels $B_{i\beta}$ covered by the optical system $C_i$ emits a light beam.

This method is advantageous because it makes it possible to obtain a light display without ghost images.

In an exemplary implementation of the method, each optical system $C_i$ comprises an optical lens configured so as to be traversed by at least part of the light beams likely to be emitted by the primary and secondary sub-pixels $A_{i\beta}$, $B_{i\beta}$ which it covers by ensuring their optical transformation in order to emit at the output a transformed light beam at least in part made directional in a principal direction D1, D2 and in which the optoelectronic device 10 comprises at least one collimation angle changing element 122 configured to act on at least one of the optical systems $C_i$ so to selectively place its optical lens among a plurality of distinct optical configurations where the angle formed between the main direction D1, D2 and the substrate 101 varies from one optical configuration to another optical configuration. The controlling method is such that the phase comprises a step e), implemented before step c), consisting in actuating the collimation angle changing element 122 so as to vary the angle formed between the main direction D1, D2 and the substrate 101 at least once so as to place the optical lens successively in at least two distinct optical configurations.

This example is advantageous because it makes it possible to obtain a display of three-dimensional images having a high resolution.

The invention claimed is:

1. An optoelectronic device configured to emit light, in particular to display images, or to capture light, the optoelectronic device comprising:
   at least one set of primary pixels where each primary pixel is arranged on a free surface of a substrate and comprises at least one primary sub-pixel capable of emitting a primary light beam on the side opposite to the substrate,
   at least one set of secondary pixels where the secondary pixels are arranged on the free surface of the substrate alternately with the primary pixels so that each primary pixel is adjacent to at least one secondary pixel and each secondary pixel comprises at least one secondary sub-pixel capable of emitting a secondary light beam on the side opposite to the substrate,
   a set of optical systems where each optical system is arranged so as to be able to cover, on the side opposite to the substrate, both the entirety of a pixel belonging to one of the sets of pixels selected from the set of primary pixels and the set of secondary pixels and at least part of sub-pixels of at least one of the adjacent pixels belonging to the other of the sets of pixels, each optical system being configured to act optically on all or part of the light beams likely to be emitted by the sub-pixels belonging to the pixels that it covers, the total number of pixels of the sets of primary and secondary pixels being greater or equal to twice the number of optical systems contained in the set of optical systems, and
   at least one displacement mechanism making it possible to apply a relative movement between the set of optical systems and the sets of pixels in a predetermined sequence, wherein said at least one displacement mechanism acts on at least one element selected from the group consisting of the set of optical systems, the set of primary pixels and the set of secondary pixels, in such a way that each optical system is likely to occupy:
   a first position in which the optical system simultaneously covers all of the primary sub-pixels of one of the primary pixels and at least part of the secondary sub-pixels of at least one of the adjacent secondary pixels,
   a second position in which the optical system simultaneously covers all of the secondary sub-pixels of one of the secondary pixels and at least part of the primary sub-pixels of at least one of the adjacent primary pixels, the predetermined sequence passing through a controlled variation between the first position and second position.

2. The optoelectronic device according to claim 1, wherein each of the primary and secondary pixels is likely to adopt a first light configuration in which all of the sub-pixels which compose it, emit a light beam and in which each optical system is likely to occupy either the first position when the primary pixel that it covers adopts the first light configuration, or the second position when the secondary pixel which it covers adopts the first light configuration.

3. The optoelectronic device according to claim 1, wherein said at least one displacement mechanism acts on at least one element selected from the group consisting of the set of optical systems, the set of primary pixels and the set of secondary pixels, in such a way that each optical system is likely to occupy a third position in which the optical system simultaneously covers part of the primary sub-pixels of one of the primary pixels and part of the secondary sub-pixels of at least one of the adjacent secondary pixels, the predetermined sequence passing through a controlled variation between the first position, the second position and the third position.

4. The optoelectronic device according to claim 3, wherein each of the primary and secondary pixels is likely to adopt a second light configuration in which part of the sub-pixels which compose it, emit a light beam and in which each optical system is likely to occupy the third position when at least one of the primary pixels and at least one of the secondary pixels that it covers by occupying the third position simultaneously adopt the second light configuration, at least one of the primary sub-pixels and at least one of the secondary sub-pixels covered by the optical system occupying the third position emitting a light beam.

5. The optoelectronic device according to claim 4, wherein the predetermined sequence provides a frequency f for the alternations between the first light configuration and the second light configuration, and for the displacements of each optical system of one among the first and second positions towards the third position, expressed in Hz, verifying the formula $f \geq 24*n$ where n is the number of possible translational movements of the optical system by said at least one displacement mechanism.

6. The optoelectronic device according to claim 1, wherein said at least one displacement mechanism comprises piezoelectric actuators and/or micro-actuators such as piezoelectric materials and/or electroactive polymers and/or shape memory alloys and/or magnetic actuators.

7. The optoelectronic device according to claim 1, wherein each optical system comprises an optical lens configured so as to be traversed by at least part of the light beams likely to be emitted by the primary and secondary sub-pixels which it covers while ensuring their optical transformation in order to emit at the output a transformed light beam at least in part made directional in a main direction.

8. The optoelectronic device according to claim 7, wherein the optoelectronic device comprises at least one collimation angle changing element configured to act on at least one of the optical systems so as to selectively place its optical lens among a plurality of distinct optical configurations, the angle formed between the main direction and the substrate varying from one optical configuration to another optical configuration.

9. The optoelectronic device according to claim 8, wherein the collimation angle changing element comprises piezoelectric elements in the optical lens and/or micro actuators such as piezoelectric materials and/or electroactive polymers and/or shape memory alloys and/or magnetic actuators and/or actuatable liquid crystals that the optical lens incorporates.

10. The optoelectronic device according to claim 8, wherein at least one among said at least one displacement mechanism and said at least one collimation angle changing element is configured to act on the optical system so that the optical system is displaced at least in part transverse to the free surface of the substrate.

11. The optoelectronic device according to claim 8, wherein at least one among said at least one displacement mechanism and said at least one collimation angle changing element is configured to act on the optical system so that the optical system is displaced at least in part generally parallel to the free surface of the substrate.

12. The optoelectronic device according to claim 1, wherein within the set of optical systems, all the optical systems are linked together so as to form a monolithic unitary assembly within which each optical system is fixed with respect to all the others optical systems.

13. The optoelectronic device according to claim 7, wherein the optical lens is configured to define a convex surface receiving at least one of the primary light beams or at least one of the secondary light beams and a flat surface by which the transformed beam is emitted.

14. The optoelectronic device according to claim 1, wherein the light beams of the primary sub-pixels composing the primary pixel together form a primary emissive surface of which an area measured in a plane parallel to the free surface of the substrate is different from an area representing the spatial extension, measured in the same plane parallel to the free surface of the substrate, of the set of primary sub-pixels composing the primary pixel, or
in which the light beams of the primary sub-pixels composing the secondary pixel together form a primary emissive surface with an area measured in the same plane parallel to the free surface of the substrate is different from an area representing the spatial extension, measured in the same plane parallel to the free surface of the substrate, of the set of secondary sub-pixels composing the secondary pixel.

15. The optoelectronic device according to claim 7 wherein each optical lens of at least two adjacent optical systems defines at least one polygonal shape and wherein the optical lenses of the two adjacent optical systems are contiguous along at least one face of the polygonal shape.

16. An image display system comprising:
at least one optoelectronic device according to claim 5,
at least one graphic calculator capable of calculating images to be displayed by the optoelectronic device and transmitting said images to be displayed to the device optoelectronic,
the graphic calculator being configured to calculate at least one set of images to be displayed successively comprising n+1 images to be successively displayed, the set of images to be displayed successively comprising an image to be displayed comprising data relating to the set of primary pixels and n images to be displayed comprising data relating to the n sets of primary pixels corresponding to n displacements of the set of optical systems,
each image to be displayed being transmitted to the optoelectronic device by the graphic calculator synchronously with each displacement of the set of optical systems.

17. A method for controlling an optoelectronic device configured to emit light, in particular to display images, or to capture light, in which the optoelectronic device comprises:
at least one set of primary pixels where each primary pixel is arranged on a free surface of a substrate and comprises at least one primary sub-pixel capable of emitting a primary light beam on the side opposite the substrate,
at least one set of secondary pixels where the secondary pixels are arranged on the free surface of the substrate alternately with the primary pixels so that each primary pixel is adjacent to at least one secondary pixel and each secondary pixel comprises at least one secondary sub-pixel capable of emitting a secondary light beam on the side opposite the substrate,
a set of optical systems where each optical system is arranged so as to be able to cover, on the side opposite to the substrate, both the entirety of a pixel belonging to one of the sets of pixels selected from the set of primary pixels and the set of secondary pixels and at least part of the sub-pixels of at least one of the adjacent pixels belonging to the other of the sets of pixels, each optical system being configured to act optically on all or part of the light beams likely to be emitted by the sub-pixels belonging to the pixels that it covers, the total number of pixels of the sets of primary and secondary pixels being greater than or equal to twice the number of optical systems contained in the set of optical systems,
at least one displacement mechanism making it possible to apply a sequential relative movement between the set of optical systems and the sets of pixels in a predetermined sequence,
the controlling method comprising, for the implementation of said predetermined sequence, a phase repeated periodically over time and comprising the following steps:
a) controlling said at least one displacement mechanism in a manner allowing each optical system to be placed in a first position in which the optical system simultaneously covers all of the primary sub-pixels of one of the primary pixels and part of the secondary sub-pixels of at least one of the adjacent secondary pixels or in a second position in which the optical system simultaneously covers all of the secondary sub-pixels of one of the secondary pixels and part of the primary sub-pixels of at least one of the adjacent primary pixels,
b) acting on the primary pixel or the secondary pixel of which all the sub-pixels are covered by the optical system following step a) so as to place it in a first light configuration in which all of the sub-pixels which compose it emit a light beam,
c) controlling said at least one displacement mechanism in a manner allowing to displace each optical system to place it either in the second position if the optical system occupied the first position following step a), either in the first position if the optical system occupied the second position following step a), or in a third position in which the optical system simultaneously covers part of the primary sub-pixels of one of the primary pixels and part of the secondary sub-pixels of at least one adjacent secondary pixels, and d) acting either on the primary pixel or the secondary pixel whose all the sub-pixels are covered by the optical system following step c) so as to place it in the first light configuration in which all the sub-pixels that compose it emit a light beam, or at the same time on at least one primary pixel whose primary sub-pixels are covered by the optical system following step c) so as to place it in a second light configuration in which at least one of the primary sub-pixels covered by the optical system emits a light beam and on at least one secondary pixel whose secondary sub-pixels are covered by the optical system following step c) so as to place it in a second light configuration in which at least one of the secondary sub-pixels (KO covered by the optical system emits a light beam.

18. The controlling method according to claim 17, wherein each optical system comprises an optical lens configured so as to be traversed by at least part of the light beams likely to be emitted by the primary and secondary sub-pixels which it covers while ensuring their optical transformation in order to emit at the output a transformed light beam at least in part made directional in a main direction and in which the optoelectronic device comprises at least one collimation angle changing element configured to act on at least one of the optical systems so as to selectively place its optical lens among a plurality of distinct optical configurations where the angle formed between the main direction and the substrate varies from one optical configuration to another optical configuration, the controlling method being such that the phase comprises a step e), implemented before step c), including actuating the collimation angle changing element so as to vary the angle formed between the main direction and the substrate at least once so as to place the optical lens successively in at least two distinct optical configurations.

* * * * *